United States Patent
Boledovic et al.

(10) Patent No.: US 12,235,328 B1
(45) Date of Patent: Feb. 25, 2025

(54) MODULAR NETWORK TEST DEVICE WITH BATTERY MODULE AND INTELLIGENT CHARGING

(71) Applicant: VIAVI SOLUTIONS INC., Chandler, AZ (US)

(72) Inventors: Craig Boledovic, Walkersville, MD (US); Andrew Rayno, Frederick, MD (US); Mikhail Charny, Montgomery Village, MD (US)

(73) Assignee: VIAVI SOLUTIONS INC., Chandler, AZ (US)

(*) Notice: Subject to any disclaimer, the term of this patent is extended or adjusted under 35 U.S.C. 154(b) by 129 days.

(21) Appl. No.: 18/135,806

(22) Filed: Apr. 18, 2023

Related U.S. Application Data (60) Provisional application No. 63/332,120, filed on Apr. 18, 2022.

(51) Int. Cl.
*G01R 31/396* (2019.01)
*G01R 31/36* (2020.01)
*G01R 31/385* (2019.01)

(52) U.S. Cl.
CPC ......... *G01R 31/396* (2019.01); *G01R 31/385* (2019.01); *G01R 31/36* (2013.01)

(58) Field of Classification Search
CPC ...... G01R 31/00; G01R 31/36; G01R 31/385; G01R 31/396
USPC .................................................. 324/425, 426
See application file for complete search history.

(56) References Cited

U.S. PATENT DOCUMENTS

| | | | | |
|---|---|---|---|---|
| 5,888,079 A | * | 3/1999 | Norden | H04Q 1/20 439/142 |
| 7,960,992 B2 | * | 6/2011 | Co | G11C 29/56 324/757.01 |
| 9,335,799 B2 | * | 5/2016 | Nguyen | G06F 1/1601 |
| 11,323,176 B2 | * | 5/2022 | Vaez-Ghaemi | G01M 11/3109 |
| 11,601,829 B2 | * | 3/2023 | Boledovic | H04W 24/06 |
| 11,950,118 B2 | * | 4/2024 | Boledovic | H04W 24/08 |
| 2023/0189028 A1 | * | 6/2023 | Boledovic | H04W 24/08 370/252 |
| 2023/0268992 A1 | * | 8/2023 | Menon | H04B 10/071 398/16 |

* cited by examiner

*Primary Examiner* — Hoai-An D. Nguyen
(74) *Attorney, Agent, or Firm* — Mannava & Kang, P.C.

(57) ABSTRACT

A modular network test device can test optical fiber networks or other types of networks. The test device includes a base module to perform network tests and interfaces to connect to removably connectable modules that can perform other network tests and supply additional battery power to the test device. The base module can control charging and discharging of a base module battery and an external battery of a removably connectable module connected to the base module. The base module can determine power requirements of the base module and a removably connectable module to perform network tests, and control power supplied by the base module battery and the external battery to the test device based on the power requirements.

20 Claims, 11 Drawing Sheets

```
determine power requirements of base module and at least one removably
connectable module
1201
```

```
control discharging of base module battery and an external battery of the at least
one removably connected module to supply power to the test device 100 based
on the power requirements
1202
```

FIG. 12

MODULAR NETWORK TEST DEVICE WITH BATTERY MODULE AND INTELLIGENT CHARGING

PRIORITY

The present application claims priority to U.S. provisional patent application Ser. No. 63/332,120 filed on Apr. 18, 2022, which is incorporated by reference in its entirety.

BACKGROUND

Network service providers are tasked with maintaining networks and maintaining quality of service for customers. When problems arise or during installation, the service providers are tasked with testing the network and remediating service issues. However, test equipment for testing the network is expensive and service providers often must purchase different equipment to run different tests.

Network test equipment manufacturers are shifting to providing test equipment that is modular, and that can support multiple tests through multiple modules. For example, Viavi™ is a network test equipment provider that provides network test equipment that includes a modular platform that includes the capability to connect different modules to the platform to perform different tests.

For example, Viavi™ OneAdvisor™ is test equipment designed to simplify the evolving network test needs of service providers, datacenters, field technicians and contractors as they deploy, groom, and maintain a wide variety of wireline and wireless networks. The modular design of OneAdvisor™ allows network technicians to easily switch between a multitude of test scenarios including transmission protocol, fiber, or over the air radio frequency (RF) signals. For example, for service providers looking to scale to 5G or maintain 4G/3G systems, OneAdvisor™ allows the testing of fiber, RF, and Common Public Radio Interface (CPRI)/Ethernet from a single instrument, replacing multiple independent testing tools, such as optical time domain reflectometer (OTDR), cable and antenna analyzer (CAA), Fiber Scope, and spectrum analyzer. Likewise, datacenter technicians with a OneAdvisor™ in each of different locations can run an OTDR trace between data centers then test the quality of 400 Gigabit transmission between the data centers. The OneAdvisor™ simplifies both test scenarios, plus many more.

Providing adequate power to modular network test equipment can be challenging, because different modules and different test applications can have different power requirements. Furthermore, in some instances, the modular network test equipment is portable and can be used for field testing. In these instances, the technician needs a reliable, long-lasting power supply so field testing can be performed without having to wait for the test equipment to be charged.

BRIEF DESCRIPTION OF THE DRAWINGS

Features of the present disclosure are illustrated by way of examples shown in the following figures. In the following figures, like numerals indicate like elements, in which.

DETAILED DESCRIPTION

For simplicity and illustrative purposes, the present disclosure is described by referring mainly to examples thereof. In the following description, details are set forth in order to provide an understanding of the present disclosure. It will be readily apparent however, that the present disclosure may be practiced without limitation to these details. In other instances, some methods and structures have not been described in detail so as not to unnecessarily obscure the present disclosure.

Throughout the present disclosure, the terms "a" and "an" are intended to be at least one of a particular element. As used herein, the term "includes" means includes but not limited to, the term "including" means including but not limited to. The term "based on" means based at least in part on.

According to an example of the present disclosure, a modular network test device, referred to as modular test device or test device 100, includes a modular test device platform that allows modules to be plugged-in and swapped as needed to perform different network tests. Furthermore, the test device includes a battery system comprised of an internal battery and one or more battery modules that may be plugged into the modular test device platform to provide additional power as needed. The battery system includes intelligent charging and discharging of the batteries based on testing application requirements and/or user preferences for powering the test device. The test device is further discussed below.

The test device provides multiple technical advantages over existing test devices. The test device provides the ability to supply power from the internal battery and the external battery simultaneously. Thus, the test device can support test applications and modules that require more power than available from a single battery. The test device can determine the power requirements of a test application and/or module and supply power from any combination of the internal and external batteries as needed. Thus, the test device can supply battery from any combination of the internal and external batteries based on the power requirements of a test application running on the test device and/or a module.

Also, the test device can be user-configured to select which battery discharges first. In an example, the test device may detect whether an external battery is connected to the test device, and then discharging the external battery first as needed. Then, when the external battery is depleted, using the internal battery to supply power as needed. Then, the user can unplug the external battery and charge it while the internal battery supplies power for the test device.

Also, the test device can perform intelligent charging decisions. For example, the test device can make sure there is enough power for any test applications running on the test device, and charge any of the batteries if there is remaining power available for charging.

Also, the battery modules with external batteries are hot swappable so they can be removed and connected as needed. Also, one or multiple battery modules may be simultaneously connected to a base module, having the internal battery.

According to an example, the test device may include various removably connectable solution modules, various removably connectable expansion modules, battery modules, and various integrated modules that may be factory installed. According to an example, the test device may include a base module to provide core processing functionality, and other modules may also be removably connected to the base module to provide other functionality. For example, the base module includes interfaces ready to connect to various other solution modules and/or expansion modules as needed to provide the ability to perform desired tests. The base module may communicate with a synchronizing server or workstation to automatically obtain configuration settings, software options, updates, and registration.

Some examples of solution modules and/or expansion modules include but are not limited to a smart battery module, a PAM-4 400G, 200G, 100G testing module; a module for performing Quad Small Form-factor Pluggable (QSFP) and SFP Monitoring; an optical time domain reflectometer (OTDR) modules; an Optical Spectrum Analyzer (OSA) Module for optical spectrum analyzer testing by way of a coarse wavelength division multiplexer (CWDM) analyzer; a Cable and Antenna Analyzer Module; and other network, RF and optical network testing modules.

Figure 1:
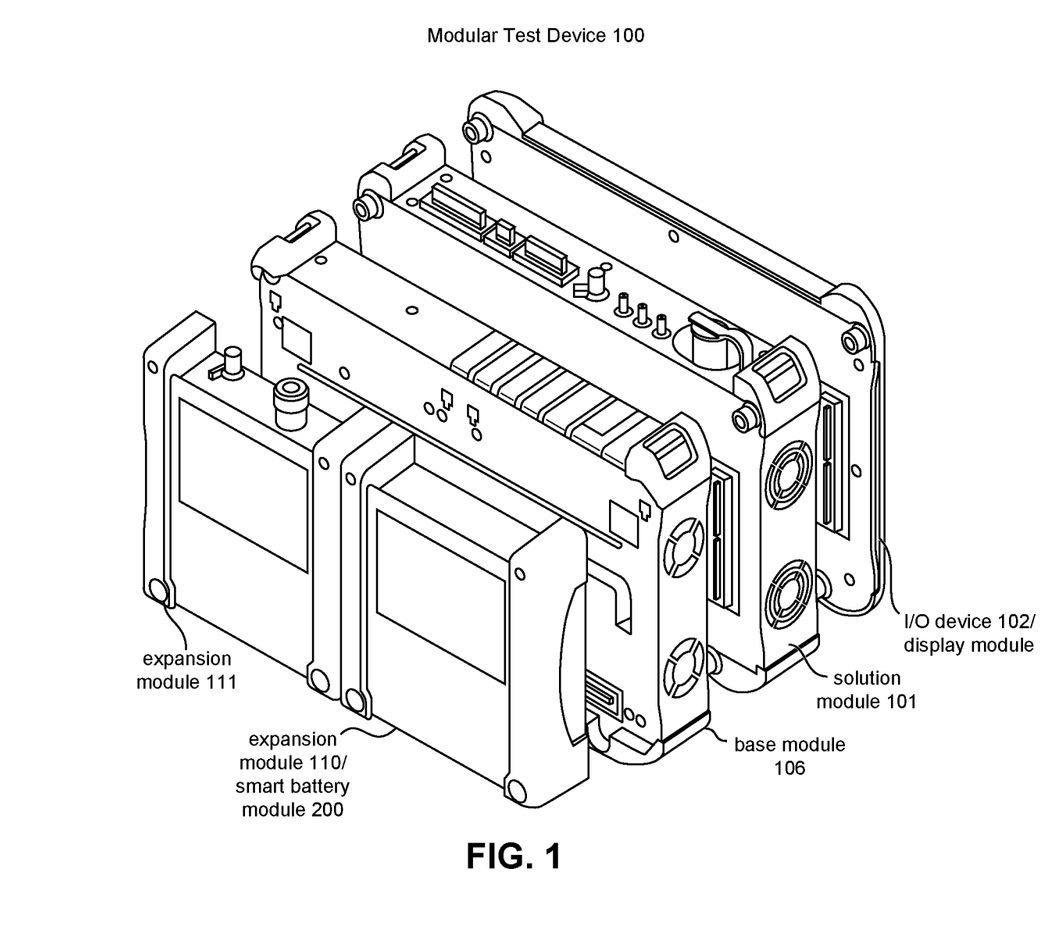
FIG. 1 shows a modular network test device, according to an example of the present disclosure.

FIG. 1 shows test device 100, including a base module 106 and other modules removably connected to the base module 106. The base module 106 includes an internal battery among other components discussed below. The other modules removably connected to the base module 106 may be referred to as a solution module or an expansion module. In an example, the expansion module is physically smaller than a solution module. Expansion module 110 may be a smart battery module containing a rechargeable external battery. The test device 100 can have multiple smart battery modules connected at the same time. For example, expansion modules 110-111 may both be smart battery modules that can be simultaneously connected to the test device 100. A solution module 101 and an I/O device 102 are removably connected modules connectable to the test device 100.

Figure 2:
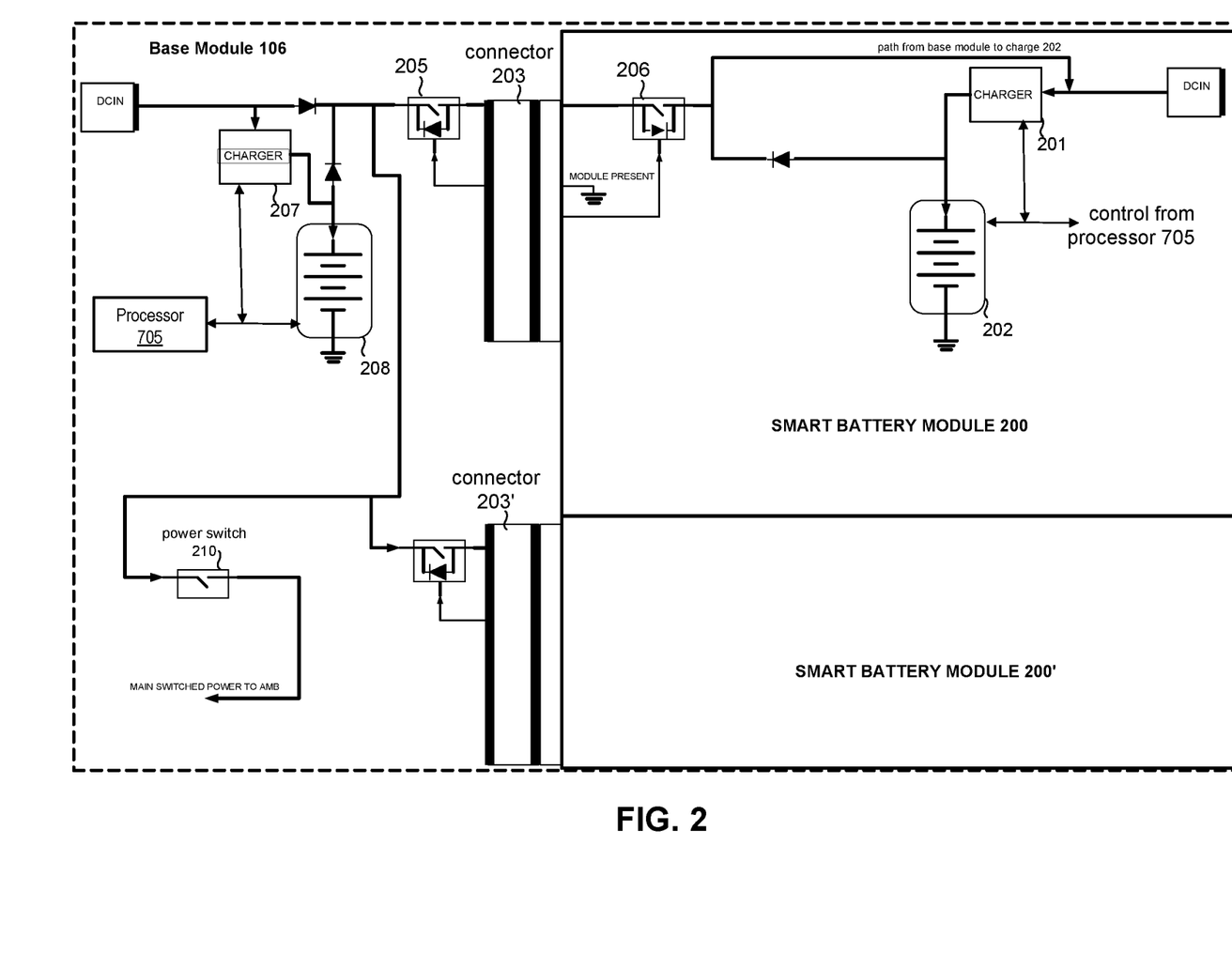
FIG. 2 shows a circuit for charging and discharging external batteries and supplying power to the test device, according to an example of the present disclosure.

FIG. 2 shows charge and discharge paths for an internal battery of the base module 106 and an external battery of smart battery module 200. FIG. 2 also shows that processor 705 of the base module 106 may connect to the internal and external batteries and chargers to control charging and discharging as needed through a control or management plane, which includes a bus separate from the power bus supplying power to the test device 100. FIG. 2 also shows that more than one smart battery module, e.g., shown as smart battery 200', may be connected to the base module 106, and the processor 705 can control charging and discharging as needed for multiple smart battery modules connected to the base module 106. Connectors 203 and 203' are also shown connecting smart battery modules 200 and 200' to base module 106. The connectors 203 and 203' are for example hardware connectors.

The smart battery module 200 includes a charger 201 and battery 202 as shown. The charger 201 may be connected to a DC power source to charge the battery 202 when it is not connected to the test device 100. When the smart battery module 200 is connected to the base module 106, hardware switches 205-206 close, thus providing charge and discharge paths. For example, when the smart battery module 200 is connected to the base module 106, the switches 205-206 close, which creates a path for the smart battery module 200 to be charged by the base module power as needed. When the smart battery module 200 is not connected to the base module 106, it can be plugged into a power supply (e.g., DCIN) to be charged. Also, a DC power supply can be connected to the base module 106 to supply power to charger 207 to charge battery 208 of the base module 106 and battery 202 of smart battery module 200.

Also, when the smart battery module 200 is connected to the base module 106, it can supply power to the test device 100 via "MAIN SWITCHED POWER TO AMB." Also, when the smart battery module 200 is connected to the base module 106, both the smart battery module 200 and the internal power can simultaneously supply power to the test device 100. Power switch 210, for example, is for the test device 100 and should be ON for the internal and/or external battery to supply power to the test device 100.

The charging and discharging are also software controllable by processor 705 of the base module 106. For example, in normal operation, the internal and external batteries discharge equally when supplying power to the test device 100. In another example, the processor 705 may control chargers and batteries so the external battery discharges first, and when the external battery is getting close to being depleted to a point where it cannot sufficiently power the test device 100, then power is supplied by the internal battery. In another example, the user may set which batteries are to supply power at any given time.

In yet another example, the processor 705 may control charging and discharging based on the power needed by testing applications and modules connected to the test device 100. The smart battery module 200 includes registers that store information about the battery and charger of the smart battery module 200. Also, the processor 705 can enable and disable charging of the external battery via the charger. Furthermore, other solution and expansion modules connected to the test device 100 may include readable storage that includes the power requirements of those solution and expansion modules. The processor can read the storage and determine the power requirements of the connected modules and any test applications that are executable by the base module 106. After the processor 705 determines the power requirements, the processor 705 can control which batteries supply power to the test device 100 based on the power requirements. In an example, assume the processor 705 determines the power requirements are 16 amps, and each of the batteries, internal and external, can supply only 8 amps.

Then, the processor 705 allows both batteries to supply power to the test device 100. However, assume the power requirements are 8 amps. Then, the processor 705 may supply power from the external battery first and then the internal battery as needed, or vice versa.

Also, if the base module 106 is receiving DC power, it can charge both the internal and external batteries simultaneously. However, the processor 705 can control charging so it is sequential, such as the internal battery is charged first, and then the external battery is charged. Other charging sequences can be set as needed.

Figure 3:
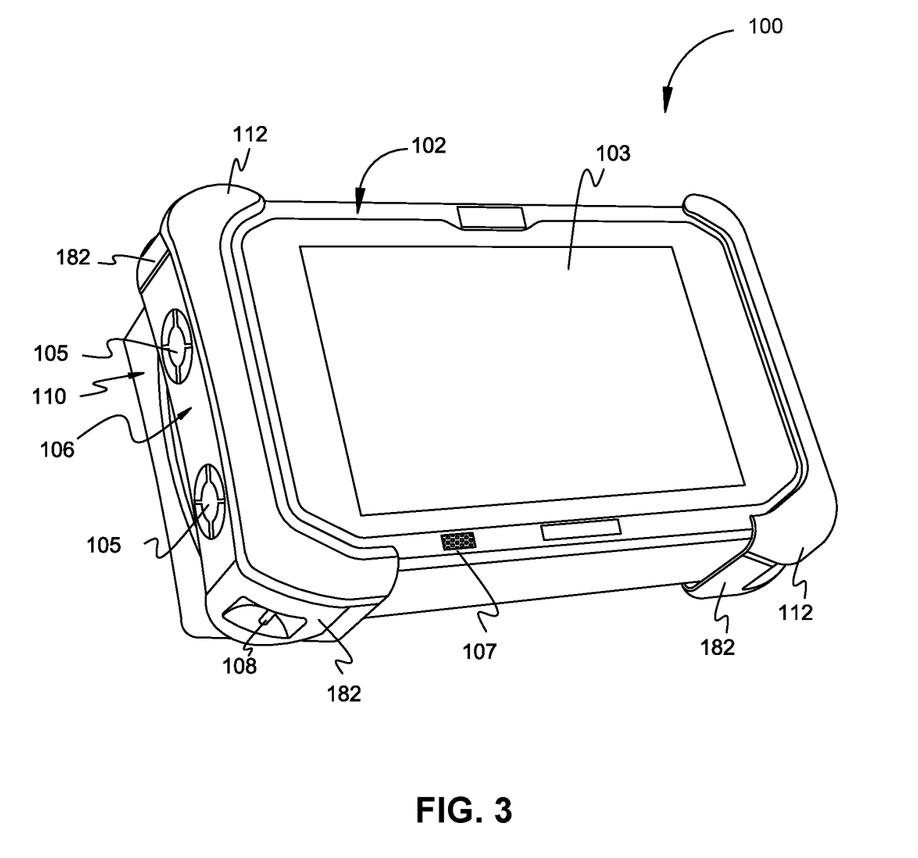
FIG. 3 illustrates a perspective view of a test device including a base module and an input/output (I/O) device, according to an example of the present disclosure.

FIG. 3 illustrates a perspective view of the modular test device 100 including base module 106 and I/O device 102 (which may be removably connected), according to an example of the present disclosure. Test device 100 may be a modular hand-held tool comprising removably connectable field replaceable modules. In an example, the modules are used for cell site installation, testing, measurement, and maintenance. In another example, the modules are used for testing high capacity networks, including optical 400G networks. According to an example, test device 100 includes removably connectable I/O device 102, and a removably connectable base module 106. According to an example, I/O device 102 includes a display 103 that provides user control and information. According to an example, display 103 may be a touch screen, e.g., liquid crystal display (LCD) touchscreen. The test device 100 provides user information including: a listing of jobs, a listing of reports to be compiled, a compilation of executed test results in a test report or test reports, and an interface control with a work station or server, described in greater detail below. Base module 106 provides hardware, software and firmware, described in greater detail below, to control test device 100.

According to the illustrated example of FIG. 3, ventilation ports 105 are provided to the outer structure of base module 106 to facilitate internal cooling of components by way of an internal cooling unit. Loudspeaker 107 provides audio information. Base module 106 provides a structural base for test device 100, and includes support structures 108 for attachment of a support strap (not shown). According to an example, support structures 108 are metal pins permanently secured to the structure of base module 106. I/O device 102 includes elastomeric bumpers 112 to provide impact protection. Likewise, base module 106 includes elastomeric bumpers 182.

According to an example, test device 100 may be configured in a variety of assemblies with a plurality of different removably connectable modules to support workflow and project specifications. According to the illustrated example of FIG. 3, test device 100 includes first expansion module 110 removably connected to the bottom of base module 106.

Figure 4:
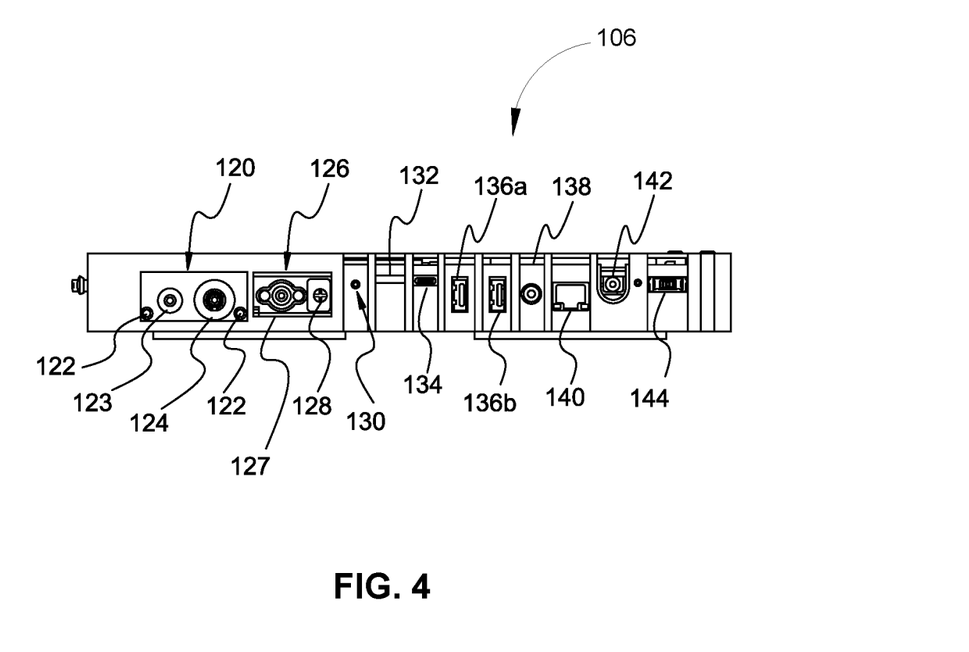
FIG. 4 illustrates a back side view of a base module, according to an example of the present disclosure.

FIG. 4 illustrates a back side view of base module 106, according to an example. Base module 106 includes a plurality of modular elements which may be used for cell site installation, testing, measurement, and maintenance. The modular elements, for example, are included in the base module 106. The modular elements may include PM-DL 120, also known as a power meter/datalink optical module. PM-DL 120 and other modular elements described herein may be factory installed with base module 106. In an example, PM-DL 120 is secured by way of connection members 122. Connection members 122 provide integration of PM-DL 120 and mechanical structural support for an optical connection. PM-DL 120 includes power meter port 123 and TS-PC port 124, also known as a Talkset-Datalink port. Power meter port 123 is used to determine optical power of a fiber under test. TS-PC port 124 is used to communicate voice or data with another device along an optical fiber.

Power meter port 123 and TS-PC port 124 may be optical Universal Push Pull (UPP) connectors, compatible with all diameter 2.5 mm connectors (fiber connector (FC), subscriber connector (SC), straight tip (ST) connector, Deutsches Institut für Normung (DIN) connector, E2000, etc.). An FC connector is a single mode connector using a 2.5 mm ferrule according to Telecommunications Industry Association (TIA) connector intermateability standard FOCIS-4 (TIA-604-4). An SC connector is a snap-in connector using a 2.5 mm ferrule according to TIA connector intermateability standard FOCIS-3 (TIA-604-3). An ST connector is a spring loaded optical connector that has a bayonet mount and a long cylindrical 2.5 mm ceramic ferrule to hold the fiber according to TIA connector intermateability standard FOCIS-2 (TIA-604-2). A DIN connector is a fiber connector having a 2.5 mm ferrule and a screw type connector according to International Electrotechnical Commission standard IEC 61754-3. An E-2000 connector is a fiber connector having a 2.5 mm ferrule and a snap coupling and a light and dust cap according to IEC standard 61754-15.

According to an example, base module 106 also includes VFL 126, also known as a Visual Fault Locator module, to provide detection of a visual fault location. VFL 126 includes VFL optical port 127. According to an example, VFL optical port 127 is a UPP connector. A VFL test uses brightly visible light to check patch cords for defects and verify continuity. According to examples, combinations of PM-DL 120 and VFL 126 may provide various functions including: 1. Power Meter-Only; 2. Talkset and Datalink; 3. Talkset and Datalink & Power Meter; 4. VFL-Only; and 5. VFL & Power Meter.

According to an example, base module 106 includes a number of additional inputs and control interfaces as follows. Boot select button 130 may be depressed to perform a selective boot. Micro-SD port 132 provides removable storage to test device 100 by accepting a micro-SD card. The micro-SD card may provide memory for storing cell site data, predetermined setup configurations, test results, and compiled reports. USB-C port 134 provides an interface to test device 100 according to the USB-C standard. USB-C port 134 also provides a debug-serial-port to support testing and trouble-shooting of test device 100. An audio interface, and/or headset may be multiplexed with USB-C port 134 by way of an external adapter, such as a USB-C to 3 mm adapter. A pair of USB-A Interfaces 136*a* and 136*b* provides support for connection of USB 2.0/3.0 peripherals, such as an external fiber microscope, set forth in greater detail below.

Audio jack 138 provides a direct audio interface by accepting a 3 mm male plug. Ethernet port 140 is RJ-45 jack to provide 10/100/1000-baseT Ethernet management. On/Off switch 142 is configured to turn test device 100 on and off. DC input 144 is configured to receive DC power for test device 100 from an external power supply. In addition, an internal smart battery module may provide DC power. Although not illustrated in FIG. 4, a mini USB port may also be provided. Internal to base module 106 is a wireless network module to support wireless network communication, such as at 2.4 GHz and 5 GHZ, and a Bluetooth module to support Bluetooth communication with an external device, such as a Bluetooth audio headset.

Figure 5:
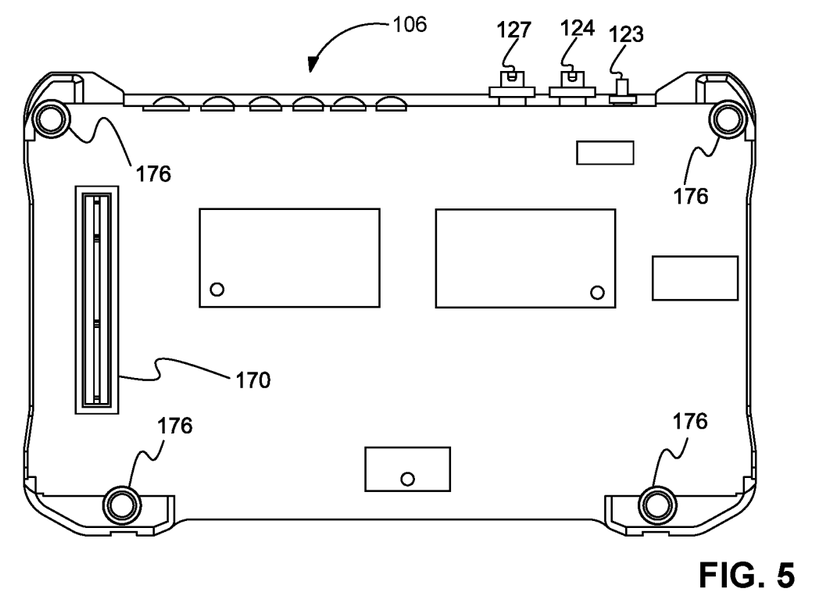
FIG. 5 illustrates a top view of a base module, according to an example of the present disclosure.

FIG. 5 illustrates a top view of base module 106, according to an example of the present disclosure. Base module 106 includes a plurality of through holes 176 to mate with corresponding protrusions 174 in the housing of I/O device 102. Base module 106 provides electrical power and communication to I/O device 102 or other modules, including solution modules and expansion modules, by way of base module backplane interface 170. According to an example, base module backplane interface 170 is a 140-pin connector having 0.1 mm pitch Gold-Fingers.

Figure 6:
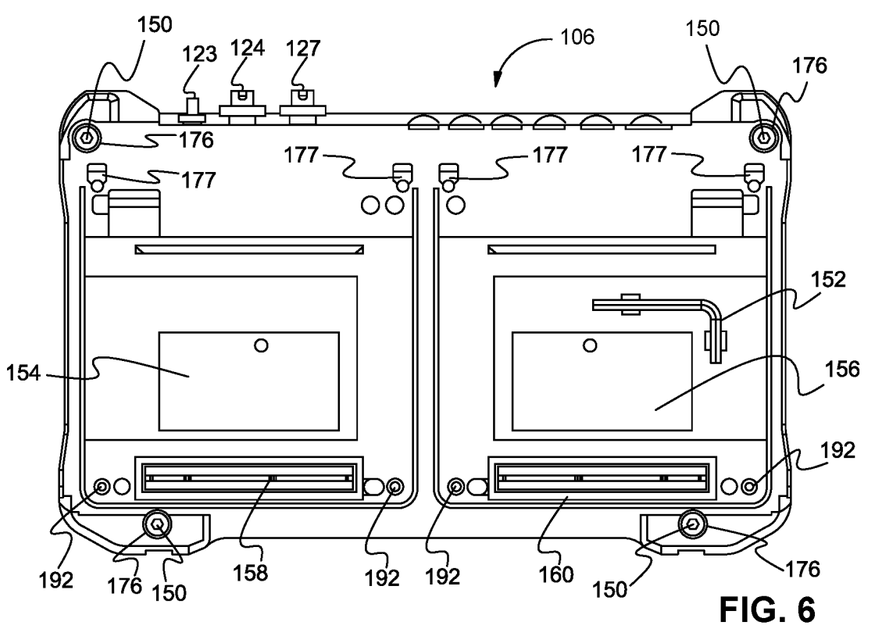
FIG. 6 illustrates a bottom view of a base module, according to an example of the present disclosure.

FIG. 6 illustrates a bottom view of base module 106, according to an example of the present disclosure. Base module 106 includes a plurality of through holes 176 to receive a plurality of connection members 150 to removably secure base module 106 to I/O device 102. If another solution module is removably inserted between base module 106 and I/O device 102, connection members 150 pass through structurally defined holes in the inserted solution module before being received into I/O device 102. According to an example, connection members 150 are machine screws having a hexagonal head. According to an example, connection tool 152 is disposed within base module 106 to support field replacement of different removably connectable solution modules (attachable to a top side of base module 106). According to an example, connection tool 152 is an Allen wrench having a hexagonal head to mate with connection members 150. Base module 106 includes a plurality of access panels, such as access panels 154 and 156 to support factory installation of various internal modules, such as the wireless network module or Bluetooth module.

Base module 106 includes first expansion interface 158 and second expansion interface 160 to provide electrical communication and power to a plurality of different expansion modules. According to an example, first expansion interface 158 and second expansion interface 160 are 140 pin connectors having. 0.1 mm pitch Gold-Fingers. Threaded bushings 192 receive structural members, which pass through holes in the expansion modules to be received therein.

Figure 7:
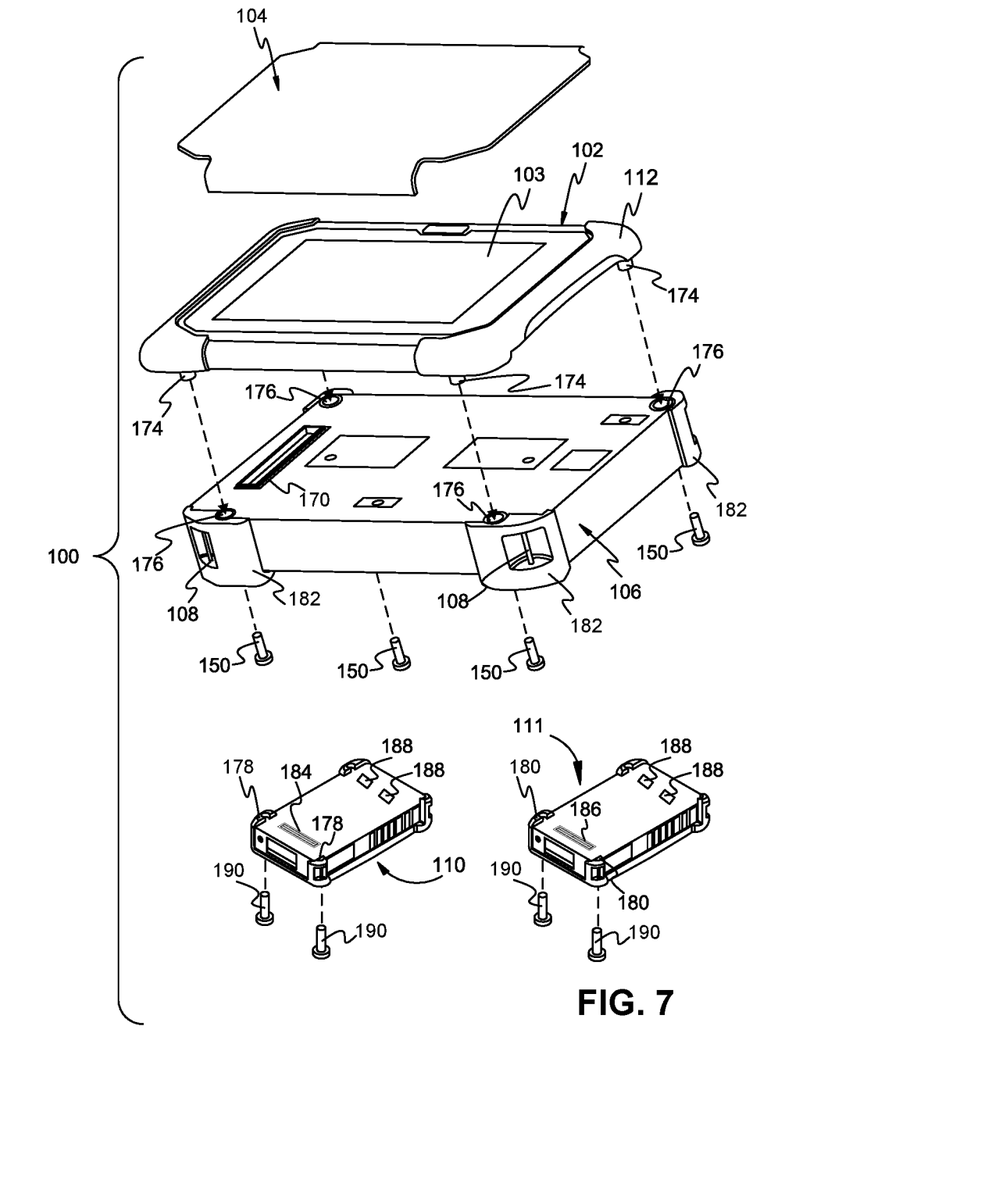
FIG. 7 illustrates an exploded perspective view of a test device including an I/O device, a base module, and dual expansion modules, according to an example of the present disclosure.

FIG. 7 illustrates an exploded perspective view of test device 100 including I/O device 102, base module 106, and expansion modules 110 and 111, according to an example of the present disclosure. An optional screen cover 104 may be removably attached to the housing of I/O device 102 to provide protection to display 103. Base module 106 is removably connected to I/O device 102 by a plurality of connection members 150. According to an example, I/O device 102 includes a plurality of protrusions 174 that are configured to be received within through-holes 176 defined by the structural housing of base module 106. Connection members 150 pass through holes 176 and are removably received within protrusions 174 to create an integrated modular test device 100. As illustrated, elastomeric bumpers 182 are disposed about the corners of base module 106 to provide impact protection.

According to an example, first expansion module 110 has structure defining holes 178 and expansion module 111 has structure defining holes 180. Connection members 190 pass through holes 178 and 180 and are received within threaded bushings 192 of base module 106. Electrostatic discharge (ESD) contacts 188 of expansion modules 110 and 111 ensure a ground connection between modules.

First expansion module 110 includes expansion interface 184 to communicate power and control signals with base module 106. Likewise, expansion module 111 includes expansion interface 186 to communicate power and control signals. According to an example, expansion interfaces 184 and 186 are 140 pin connectors having 0.1 mm pitch Gold-Fingers to mate with first and second expansion interfaces 158, 160 in base module 106. According to an example, expansion modules 110 and 111 are field replaceable. For example, the expansion modules may include one or more 400G and 100G modules. According to an example, either of expansion modules 110 or 111 may be a smart battery module. According to an example, either of expansion modules 110 or 111 may be a spacer module that does not contain internal components or a battery.

Figure 8:
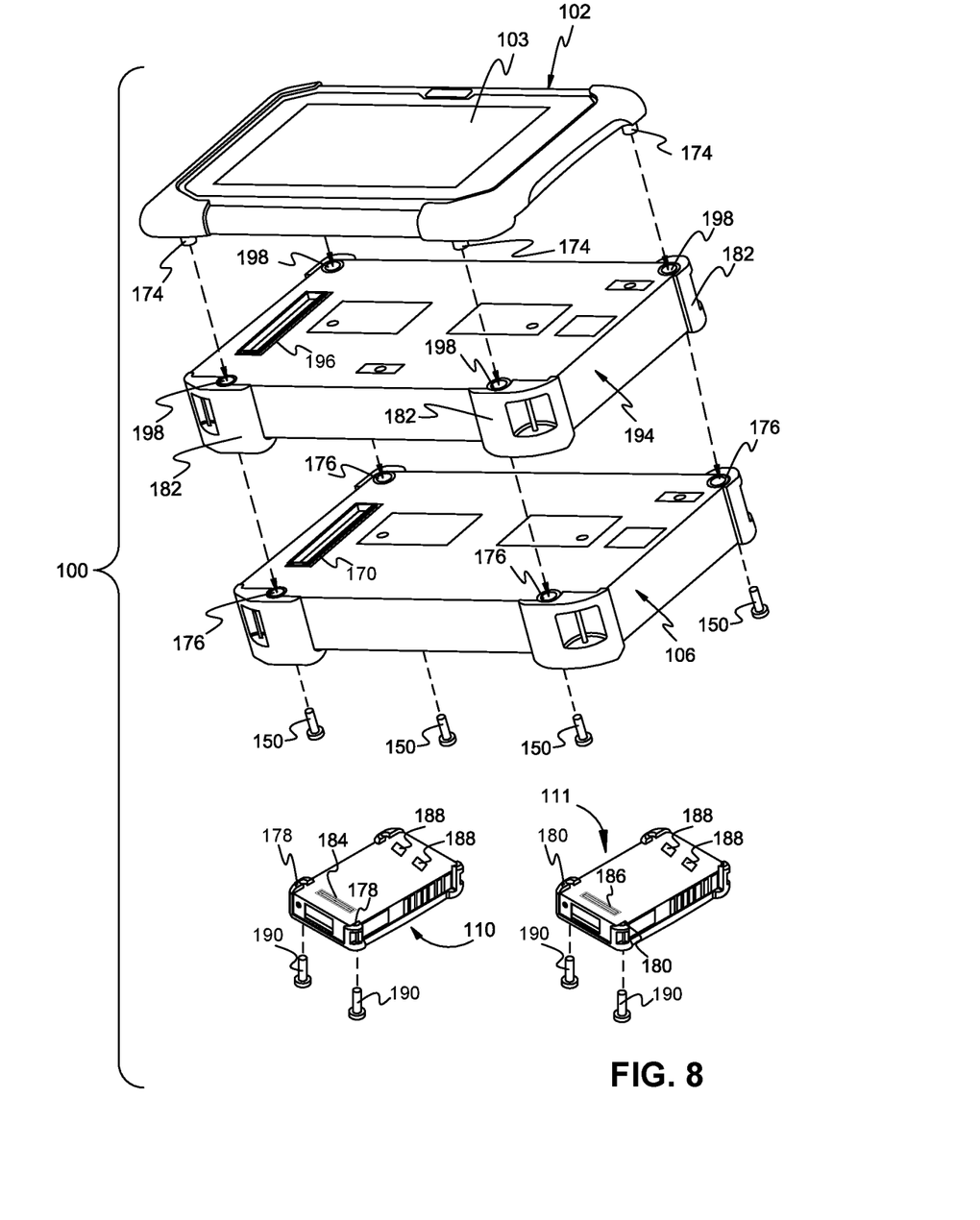
FIG. 8 illustrates an exploded perspective view of a test device including a removably connected first solution module, according to an example of the present disclosure.

FIG. 8 illustrates an exploded perspective view of test device 100 including a removably connected module 194, according to an example of the present disclosure. Upon integration of module 194, base module 106 provides electrical power and communication to module 194 by base module backplane interface 170. Likewise, module 194 provides electrical power and communication to I/O device 102 by way of top solution interface 196. Module 194 also includes a bottom solution interface (not shown) connectable to base module backplane interface 170, described in greater detail below. According to another example, a second module may be optionally disposed between module 194 and base module 106, described in greater detail below. The base module backplane interface 170 connects power and communication (e.g., carrying data) busses of the base module 106 to modules connected to the base module 106 via base module backplane interface 170 or other interfaces.

Module 194 has a similar housing and form factor to base module 106 to provide integration between I/O device 102 and base module 106. Module 194 includes a plurality of through holes 198 to mate with corresponding protrusions 174 in the housing of I/O device 102. Module 194 provides electrical power and communication to I/O device 102 by way of top solution interface 196. According to an example, top solution interface 196 is a 140-pin connector having. 0.1 mm pitch Gold-Fingers. Module 194 also provides a structural base for test device 100, and includes additional support structures for attachment of a support strap (not shown). Module 194 is removably connected to I/O device 102 by connection members 150. As illustrated, Module 194 also includes elastomeric bumpers 182 for impact protection.

Figure 9:
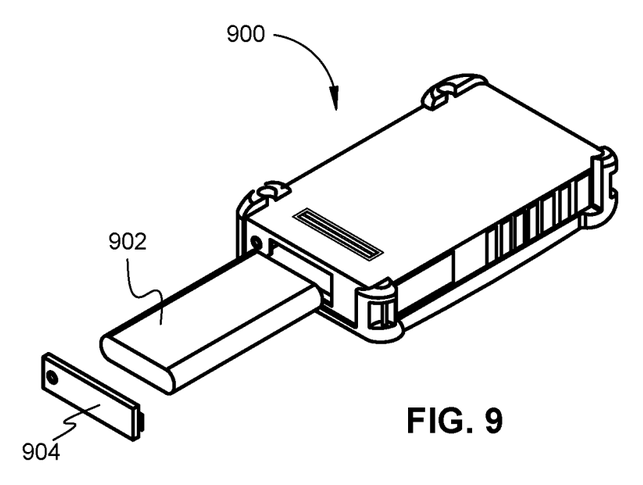
FIG. 9 illustrates a perspective view of a removable battery that May be contained in a base module, according to an example of the present disclosure.

FIG. 9 illustrates a perspective view of a removable battery 900 that may be contained in the base module 106. For example, battery 902 is removably disposed therein, and secured by battery door 904.

Figure 10:
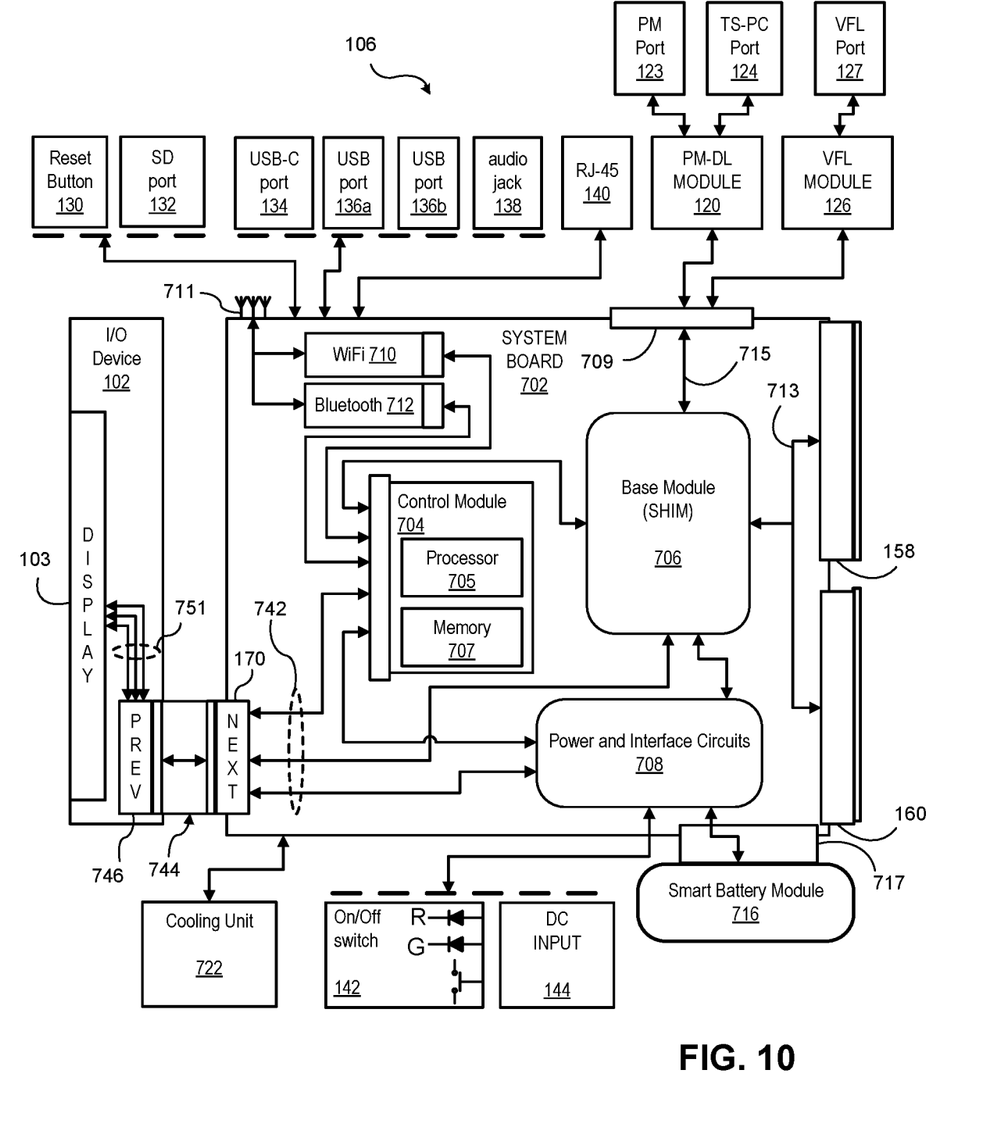
FIG. 10 illustrates a high-level system diagram of a base module and an I/O device, according to an example of the present disclosure.

FIG. 10 illustrates a high level system diagram of base module 106 and I/O device 102, according to an example of the present disclosure. Base module 106 includes system board 702 with interfaces to removably connect to various solution modules and expansion modules to form test device 100. System board 702 removably connects to I/O device 102, which houses and supports display 103. According to an example, I/O device 102 is embodied in a modular housing, which is removably connectable to base module 106. According to an example, display 103 is disposed within I/O device 102 and a GUI may be generated on the display 103 to provide user control of test device 100 for testing and measurement. The modular housing of I/O device 102 permits both field replaceability and connection of various additional solution modules. According to an example, base module 106 is on the order of 10″ wide to permit hand carry by a field technician.

System board 702 includes a control module 704. According to an example, control module 704 includes processor 705 and memory 707. According to an example, processor 705 may include a programmable and replaceable processor module/card used in a test device system where pluggable/upgradable/flexible processor selection is desired. According to an example, processor 705 may be a multi-core, programmable, processor. According to an example memory 707 may be a I2C EEPROM. Processor 705 processes software instructions stored in memory 707.

According to an example, control module 704 facilitates a flexible processor choice for processor 705 such as an iMX6 or iMX8 processor from NXP semiconductor or other processor. Control module 704 may be a SMARC control module based on SMARC Version 2.0, and capable of supplying up to 15 W (5V/3 A) to processor 705. SMARC is a versatile small form factor computer Module definition. SMARC is essentially a replaceable processor module/card used in a system where pluggable/upgradable/flexible processor selection is desired. SMARC is a specification published by the Standardization Group for Embedded Technologies for computer-on-modules (i.e., COMs). SMARC Computer-on-Modules are specifically designed for the development of extremely compact low-power systems. SMARC modules can also be fitted with other low-power System-on-Chip (SoC) architectures, like, for example, ones based on x86 SoCs.

System board 702 includes base module SHIM 706, which is a Software/Hardware Interface for Multi-Manycore (SHIM) interface, such as set forth in 2804-2019—IEEE Standard for Software-Hardware Interface for Multi-Many-Core. Base module SHIM 706 provides an architecture to support connection to a plurality of additional modules. Base module SHIM 706 connects to PM-DL 120 and VFL 126 with base module bus 715 through with base module interface 709. Base module SHIM 706 connects to expansion interfaces 158 and 160 with expansion bus 713. Base module SHIM 706 connects to base module backplane interface 170 through base module backplane 742. According to an example, expansion interfaces 158 and 160 are 140 pin connectors having 0.1 mm pitch Gold-Fingers to electrically mate with a plurality of different modules. Base module SHIM 706 connects to power and interface circuits 708 to distribute power to connected modules through base module bus 715 and expansion bus 713.

According to an example, I/O device 102 is removably connectable to base module 106. I/O device 102 includes a display 103 that provides user control and user information, a listing of predetermined tests to be executed (i.e., a predetermined test plan), a listing of reports to be compiled, a compilation of executed test results in test reports, and interface control for communication with a work station or server. I/O device 102 includes an I/O backplane 751 that connects to base module backplane 742 of base module 106 at backplane interface junction 744. I/O backplane interface 746 forms part of I/O device 102 and base module backplane interface 170 forms part of base module 106. Together, I/O backplane interface 746 and base module backplane interface 170 form junction backplane interface junction 744. The designation of PREV and NEXT provide a reference for connectivity of various modules in various configurations to base module backplane 742.

According to an example, I/O device 102 is contained in a removable modular housing. In other words, display 103 functions as a special solution module. This permits both field replaceability and access within the platform to insert additional solution modules. According to an embodiment, display 103 supports a 1280×800 resolution with multi-touch capacitive interface capability. According to an example, a screen size on the order of 10" diagonal size is provided. According to another example, a screen size on the order of 8" diagonal size is provided. According to an example, display 103 is backlit to provide readable brightness in an outdoor environment.

According to an example, power and interface circuits 708 receive power from internal smart battery module 716 by way of smart battery interface 717. According to an example, internal smart battery module 716 includes a dedicated battery internal to the structure of the base module 106. The dedicated internal battery is field replaceable and is also rechargeable via power and interface circuits 708. The power and interface circuits 708 may also receive power by way of DC input 144. Power and interface circuits 708 may also receive power by way of an expansion module containing a smart battery. Operation of base module 106 is initiated or turned off by way of On/Off switch 142. Accordingly, the internal battery within internal smart battery module 716 may be recharged when DC power is supplied by way of DC input 144. The internal circuitry of base module 106 is cooled by cooling unit 722, which may include a fan, a heat sink, a temperature senor and/or combination thereof. According to an example, control of a fan within cooling unit 722 is provided by way of a temperature sensor that provides a temperature indication signal to Control module 704, which in turn controls operation of the fan.

Boot select button 130 may be depressed to perform a selective boot. The micro-SD card may provide memory for storing customer data, setup configurations, reports, and test results. A pair of USB ports 136*a* and 136*b* provides support for connection of USB 2.0/3.0 peripherals. USB-C port 134 provides a debug-serial-port to support testing and troubleshooting of base module 106, and an external audio interface (and/or headset). The external headset may be multiplexed with USB-C port 134 by way of an external adapter, such as a USB-C to 3 mm adapter. Audio jack 138 may provide a direct audio interface by accepting a 3 mm male plug. Ethernet port 140 is an RJ-45 jack to provide 10/100/1000-baseT Ethernet management.

Wireless network module 710 provides a wireless network interface to base module 106 by way of communication between antenna 711 and Control module 704. Bluetooth module 712 provides a Bluetooth interface to base module 106 by way of communication between antenna 711 and Control module 704. According to an example, wireless network module 710 and Bluetooth module 712 form the same module. According to an example, several wireless options, such as Wi-Fi and Bluetooth configuration choices, are supported.

According to an example, wireless network module 710 or Bluetooth module 712 may be accessed separately after base module 106 is fully assembled and enclosed. This permits a factory-option of wireless network or Bluetooth to meet varying end user requirements. Although not shown, a Wireless-Module access 'door' may be provided with a special fastener, different from the connection members set forth above, to discourage access without a special-tool. According to an example, three internal Wi-Fi antennas of antennas 711 may be mounted within base module 106, and optionally one internal Bluetooth antenna.

According to an example, base module 106 includes optional PM-DL 120, also known as a power meter/datalink optical sub module. According to an example, the PM-DL 120 connects to base module SHIM 706 through base module bus 715 and base module interface 709 and is factory installed into the base module 106. PM-DL 120 includes power meter port 123 and Talkset-Datalink (TS-PC) port 124. TS-PC port 124 is an optical connector that is UPP, which is compatible with all diameter 2.5 mm connectors (FC, SC, ST, DIN, E2000, etc.). According to an example, base module 106 also includes VFL 126 to provide visual fault location. VFL 126 connects to base module SHIM 706 through base module bus 715 and base module interface 709. VFL 126 includes a VFL optical port 127. According to an example, the VFL optical port is an optical connector that is UPP, which is compatible with all diameter 2.5 mm connectors (FC, SC, ST, DIN, E2000, etc.). According to an example, optional VFL 126 is factory installed into the base module 106. According to examples, various combinations of power meter module 300 (included in PM-DL 120), talkset datalink module 320 (included in PM-DL 120), and VFL 126 are available to support: 1. Power Meter only; 2. Talkset and Datalink only; 3. Talkset and Datalink & Power Meter; 4. VFL only; and 5. VFL & Power Meter. According to an example, base module 106 also includes factory installed internal modules, supporting the following options: Talkset & Power Meter; Power Meter & VFL; VFL only; and Power Meter only.

According to an example, cooling unit 722 includes an integrated fan with a speed control to manage internal temperature of the system board 702, Control module 704, wireless network module 710, and internal smart battery module 716. Base module 106 power consumption may be affected by choice of processor module, contained within Control module 704. According to an example, base module 106 has a power budget on the order of 15 W including display 103 at full brightness (exclusive of extra power required for battery charging). According to an example, system power supplied to base module 106 from DC input 144 is a maximum of 15 A*26V (390 W). According to an example, base module 106 includes "Apple-MFI" circuitry for compatibility with "Apple" products, and all USB ports are capable of supplying 0.5 A DC at 5V to external USB Load. According to an example, an Audio/Headset may be muxed with USB-C port and accommodated using an adapter (i.e., USB-C to 3 mm). According to an example, a platform loudspeaker (not shown) is provided within base module 106 or I/O device 102 to provide audio without requirement for connection of an audio headset. According to an example, DC power may be applied to DC input 144 by way of a 160 W AC-DC Power Brick.

According to an example, internal smart battery module 716 includes a single battery, which is field replaceable. Battery access is provided without need to disassemble/remove any of its modules. According to an example, the battery compartment of base module 106 may be compatible with Inspired-Energy NH2054VV34. According to an example the primary battery may be 14.4V, 6.8 A-hr, 98 Wh, 8 A capable NH2054VV34, having a run time on the order of four hours. According to another example, dual battery support may be provided by connection of another smart battery to expansion interface 158 or expansion interface 160. An additional smart battery may provide additional power to support module scalability.

According to an example, base module 106 supports expansion modules 110 and 111 for connection at expansion interfaces 158 and 160, and full size solution modules for connection at base module backplane interface 170. According to an example, base module 106 may support up to four removably connectable modules, namely two removably connectable expansion modules by way of expansion interfaces 158 and 160, and two full-size removably connectable solution modules by way of base module backplane interface 170. In an example, the expansion modules 110 and 111 are smart battery modules removably connected to the base module 106, and the full size solution modules may include an OTDR module and/or an optical spectrum analyzer module. The processor 705 of the base module can determine power requirements of the base module 106 and a full size solution module connected to the base module and control charging and discharging of a battery of the base module 106 and a battery of the expansion module 110 depending on the power requirements of the base module 106 and a full size solution module, as is further discussed below.

Figure 11:
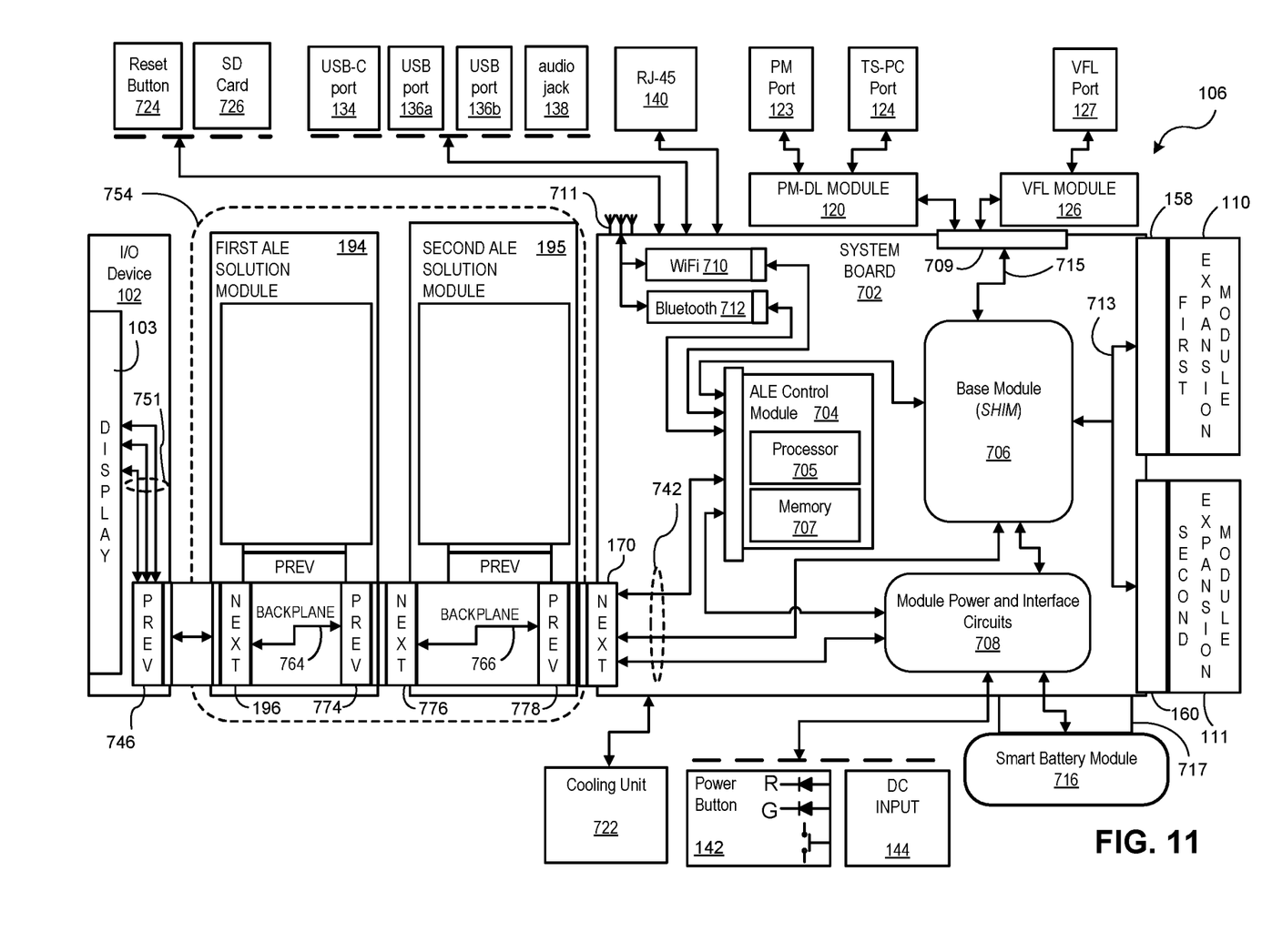
FIG. 11 illustrates a high-level system diagram of a base module a removably connected to a first solution module, a second solution module, and an I/O device, according to an example of the present disclosure.

FIG. 11 illustrates a high-level system architectural diagram of base module 106 removably connected to module 194, second solution module 195, and I/O device 102, according to an example of the present disclosure. Solution modules 194 and 195 are removably connectable between I/O device 102 and base module 106 to form an integrated test device 100. According to an example, solution modules 194 or 195 may be an optical spectrum analyzer module and an OTDR module. Base module 106 connects to expansion module 110 at first expansion interface 158 and second expansion module 111 at second expansion interface 160. Module 110 and/or 111 may be smart battery module 200. According to an example, the test device 100 including removably connected modules is a small to mid-range, hand held device.

According to the illustrated example of FIG. 11, module 194 includes a backplane 764 connected to top solution interface 196, designated as NEXT, and a bottom solution interface 774, designated as PREV. Top solution interface 196 is disposed on a top side of module 194 for connection to an interface disposed on the bottom side of an adjacent solution module, such as I/O backplane interface 746 of I/O device 102. Bottom solution interface 774 is disposed on a bottom side of module 194 for connection to an interface disposed on a top side of an adjacent solution module, such as top solution interface 776 of second solution module 195. According to an example of the test device 100 with module 194 included as a single solution module (i.e., without second solution module 195), bottom solution interface 774 connects to base module backplane interface 170.

Second solution module 195 includes a backplane 766 connected to top solution interface 776, designated as NEXT, and a bottom solution interface 778, designated as PREV. Top solution interface 776 is disposed on a top side of second solution module 195 for connection to an interface disposed on the bottom side of an adjacent solution module, such as bottom solution interface 774 of module 194. Bottom solution interface 778 is disposed on a bottom side of second solution module 195 for connection to an interface disposed on a top side of an adjacent solution module, such as backplane interface 170 of base module 106. According to an example of the test device 100 with module 194 and second solution module 195, base module backplane 742 is connected to backplane 766 of second solution module 195, backplane 764 of module 194, and backplane 751 of I/O device 102.

According to FIG. 11, module 194 and second solution module 195 include backplanes. Either module 194 or second solution module 195 may support a single internal module configuration or a dual internal module configuration.

Figure 12:
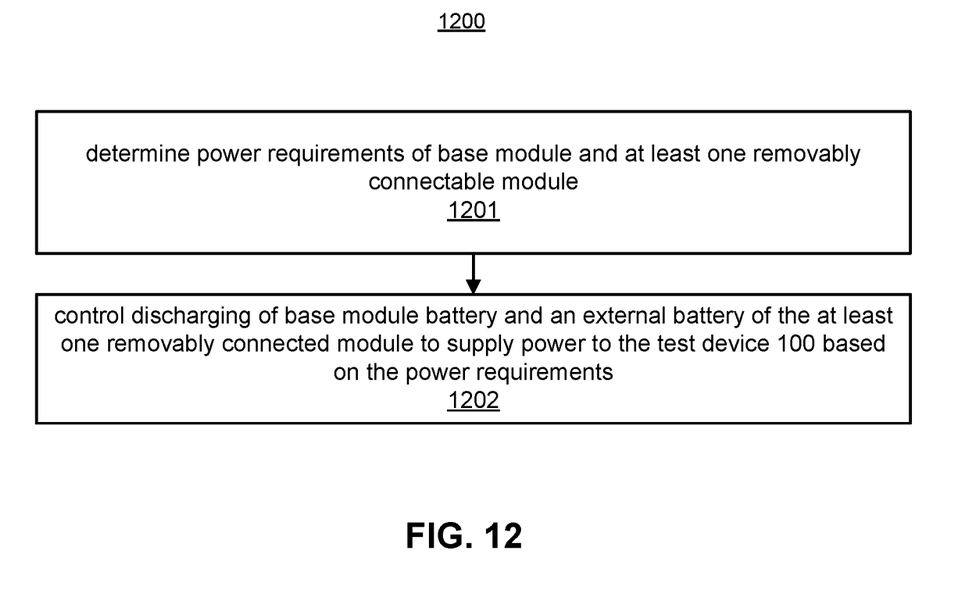
FIG. 12 illustrates a flow chart of a method that may be performed by the test device.

FIG. 12 illustrates a method 1200 that can be performed by the test device 100 to supply power from a battery of the base module 106 and/or an external battery of a removably connectable module connected to the base module based on power requirements for performing network tests by the base module and a removably connectable module.

At 1201, processor 705 determines power requirements of the base module 106 and at least one removably connectable module connected to the base module. Referring to the example shown in FIG. 11, assume solution module 194 is connected to the base module 106, and expansion module 110 is connected to the base module 106. The base module 106 may perform network tests, and the expansion module 110 may perform other network tests. For example, the test device 100 can be used to perform network tests in the field, and the base module 106 may perform fiber optic network tests for 400G networks, including optical transport service network tests that test for signal integrity, bit errors, forward error correction errors, and section and path overhead (SM/PM) errors/alarms. The solution module 194 may be an optical spectrum analyzer that scans an optical network over the full wavelength range and automatically records all channels with the ITU-T channel (ch) number, wavelength or frequency, offset and the related power level. An addition measurement of the optical signal to noise ratio (OSNR) per channel can be performed. The test results can be displayed in a graphical spectrum format or in a table of results on the display of the base module 106. The expansion module 110 may be the smart battery module 200 that provides additional battery capacity for the test device 100.

In an example, to determine power requirements of the solution module 194, the processor 705 of the base module 106 detects that the solution module 194 is connected to the base module 106, and retrieves power requirements for running the optical spectrum analyzer tests from a memory of the solution module 194. Similarly, the processor 705 may determine power requirements for the tests performed by the base module 106.

At 1202, the processor 705 controls discharging of the base module battery and an external battery of the at least one removably connected module to supply power to the test device 100 based on the power requirements. For example, as discussed with respect to FIG. 2, the processor 705 can control discharging of the battery of the smart battery module 200 and the internal battery of the base module 106 so that one or both batteries provide power to the test device 100.

In an example, the processor 705 determines power requirements of the base module 106 and the solution module 194 to run desired network tests. A user may select the network tests or the network tests may be included in a workflow that automatically executes multiple network tests. If the power requirements exceed the power that is provided by a single one of the batteries, then the processor 705 enables both batteries to supply power to the test device 100. If the power requirements do not exceed the power that is provided by a single one of the batteries, then the processor 705 enables one of the batteries to supply power to the test device 100. A default setting may include using the battery of the smart battery module until it reaches a discharge threshold, and then switching to the battery of the base module 106, or vice versa. Alternatively, user preferences may be selected to determine which battery is used first.

Also, the processor 705 can control a sequence of charging the batteries via a charger in the base module 106 and a charger in the smart battery module 200, such as shown in FIG. 2. The sequence of the charging may be controlled so that one of the batteries is charged by a DC power source before the other one of the batteries, which may be based on default settings of user preferences. Alternatively, both batteries may be charged simultaneously. For example, if the base module 106 is receiving DC power, it can charge both the internal and external batteries simultaneously. However, the processor 705 can control charging so it is sequential, such as the internal battery is charged first, and then the external battery is charged. Other charging sequences can be set as needed.

What has been described and illustrated herein is an example of the disclosure along with some of its variations. The terms, descriptions and figures used herein are set forth by way of illustration only and are not meant as limitations. Many variations are possible within the scope of the disclosure, which is intended to be defined by the following claims and their equivalents in which all terms are meant in their broadest reasonable sense unless otherwise indicated.

What is claimed is:

1. A modular network test device to test optical fiber networks or other types of networks, the test device comprising:
   a base module comprising:
      a memory;
      a processor to determine test results for a plurality of tests performed by the test device and store the test results in the memory;
      a backplane, connected to the memory and processor, carrying power and communication signals;
      a base module battery;
      a base module charger; and
      a plurality of interfaces to connect the backplane of the base module to at least one removably connectable module connectable to the base module,
   wherein the processor determines power requirements of the base module and the at least one removably connectable module if the at least one removably connectable module is connected to the base module, and the processor controls discharging of the base module battery and at least one external battery of the at least one removably connected module to supply power to the test device based on the power requirements.

2. The modular network test device of claim 1, wherein the processor controls whether the base module battery and the at least one external battery supply power to the test device simultaneously or one at a time based on the power requirements.

3. The modular network test device of claim 1, wherein the processor determines whether the power requirements exceed power supplied by one of the base module battery and the at least one external battery, and in response to determining the power requirements exceed the power supplied by one of the base module battery and the at least one external battery, the processor controls discharging of the base module battery and the at least one external battery so the base module battery and the at least one external battery supply power to the test device simultaneously.

4. The modular network test device of claim 1, wherein the processor controls whether the at least one external battery and the base module battery supply power to the test device based on user preferences stored in the test device.

5. The modular network test device of claim 1, wherein the processor controls whether a DC power source connected to the base module supplies power to charge the at least one external battery and the base module battery simultaneously or one at a time.

6. The modular network test device of claim 1, wherein the processor controls the base module charger and a charger of the at least one removably connected module to control a sequence of charging the base module battery and the at least one external battery.

7. The modular network test device of claim 1, wherein the at least one external battery is hot swappable.

8. The modular network test device of claim 1, wherein the at least one removably connectable module comprises a solution module to perform at least one of the plurality of tests and at least one battery module containing the at least one external battery, and the power requirements are determined for the base module and the solution module to perform one or more of the plurality of tests.

9. A modular network test device to test optical fiber networks or other types of networks, the test device comprising:
 a base module comprising:
  a memory;
  a processor to determine test results for a plurality of tests performed by the test device and store the test results in the memory;
  a backplane, connected to the memory and processor, carrying power and communication signals;
  a base module battery;
  a base module charger; and
  a plurality of interfaces; and
 at least one removably connectable module connectable to the base module via the plurality of interfaces,
 wherein the processor determines power requirements of the base module and the at least one removably connectable module connected to the base module, and the processor controls discharging of the base module battery and at least one external battery of the at least one removably connected module to supply power to the test device based on the power requirements.

10. The modular network test device of claim 9, wherein the at least one removably connectable module comprises a solution module to perform at least one of the plurality of tests and at least one battery module containing the at least one external battery, and the power requirements are determined for the base module and the solution module to perform one or more the plurality of tests.

11. The modular network test device of claim 9, wherein the processor controls whether the base module battery and the at least one external battery supply power to the test device simultaneously or one at a time based on the power requirements.

12. The modular network test device of claim 9, wherein the processor determines whether the power requirements exceed power supplied by one of the base module battery and the at least one external battery, and in response to determining the power requirements exceed the power supplied by one of the base module battery and the at least one external battery, the processor controls discharging of the base module battery and the at least one external battery so the base module battery and the at least one external battery supply power to the test device simultaneously.

13. The modular network test device of claim 9, wherein the processor controls whether a DC power source connected to the base module supplies power to charge the at least one external battery and the base module battery simultaneously or one at a time.

14. The modular network test device of claim 9, wherein the processor controls the base module charger and a charger of the at least one removably connected module to control a sequence of charging the base module battery and the at least one external battery.

15. A method of controlling power supplied to a modular network test device including a base module and a removably connectable module connected to the base module, the method comprising:
 determining, by a processor of the base module, power requirements of the base module and the removably connected module;
 determining whether the power requirements require power supplied simultaneously by a base module battery of the base module and at least one external battery connected to the base module; and
 in response to determining the power requirements require power supplied simultaneously by the base module battery and the at least one external battery, controlling discharge of the base module battery and the at least one external battery to supply power to the test device simultaneously.

16. The method of claim 15, comprising:
 in response to determining the power requirements do not require power supplied simultaneously by the base module battery and the at least one external battery, controlling discharge of the base module battery and the at least one external battery to supply power to the test device consecutively.

17. The method of claim 16, wherein controlling discharge of the base module battery and the at least one external battery to supply power to the test device consecutively comprises:
 controlling discharge of the base module battery and the at least one external battery so a first one of the base module battery and the at least one external battery supplies power to the test device until a discharge threshold is reached, and then a second one of the base module battery and the at least one external battery supplies power to the test device.

18. The method of claim 15, wherein determining, by a processor of the base module, power requirements of the base module and the removably connected module comprises:
 determining power requirements of at least one network test to be executed by the base module and the removably connected module.

19. The method of claim 15, comprising:
 controlling whether a DC power source connected to the base module supplies power to charge the base module battery and the at least one external battery simultaneously or one at a time.

20. The method of claim 19, wherein controlling whether a DC power source connected to the base module supplies power to charge the base module battery and the at least one external battery simultaneously or one at a time comprises:
 controlling a base module charger and a charger of at least one battery module connected to the base module to control which of the base module battery and the at least one external battery is being charged by the DC power source.

* * * * *